US008624399B2

(12) United States Patent
Usami

(10) Patent No.: US 8,624,399 B2
(45) Date of Patent: Jan. 7, 2014

(54) SEMICONDUCTOR DEVICE AND METHOD OF MANUFACTURING SEMICONDUCTOR DEVICE

(75) Inventor: Tatsuya Usami, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 349 days.

(21) Appl. No.: 12/662,331

(22) Filed: Apr. 12, 2010

(65) Prior Publication Data

US 2010/0270677 A1    Oct. 28, 2010

(30) Foreign Application Priority Data

Apr. 24, 2009    (JP) .................................. 2009-106389

(51) Int. Cl.
*H01L 23/48* (2006.01)
(52) U.S. Cl.
USPC ................... 257/773; 257/758; 257/E21.586; 257/E23.011
(58) Field of Classification Search
USPC .................. 257/773, 778, E21.586, E23.011
See application file for complete search history.

(56) References Cited

U.S. PATENT DOCUMENTS

| 7,635,646 | B2 | 12/2009 | Omoto et al. |
| 7,649,239 | B2 * | 1/2010 | Hussein et al. ............... 257/522 |
| 2002/0093075 | A1 * | 7/2002 | Gates et al. .................... 257/531 |
| 2003/0183940 | A1 * | 10/2003 | Noguchi et al. ............... 257/767 |
| 2008/0076258 | A1 | 3/2008 | Chen et al. |
| 2008/0197500 | A1 | 8/2008 | Yang et al. |
| 2008/0299766 | A1 | 12/2008 | Omoto et al. |

FOREIGN PATENT DOCUMENTS

| JP | 2000-183158 A | 6/2000 |
| JP | 2005-079434 A | 3/2005 |
| JP | 2005-175435 A | 6/2005 |
| JP | 2008-193120 A | 8/2008 |
| JP | 2008-205458 A | 9/2008 |
| JP | 2008-300652 A | 12/2008 |
| TW | 200404353 A | 3/2004 |

OTHER PUBLICATIONS

English translation of a Chinese Office Action dated Dec. 5, 2012.
Japanese Office Action dated Aug. 27, 2013 with an English translation.

* cited by examiner

*Primary Examiner* — Timor Karimy
(74) *Attorney, Agent, or Firm* — McGinn IP Law Group, PLLC

(57) ABSTRACT

An interconnect is provided in a first insulating layer and the upper surface of the interconnect is higher than the upper surface of the first insulating layer. An air gap is disposed between the interconnect and the first insulating layer. A second insulating layer is formed at least over the first insulating layer and the air gap. The second insulating layer does not cover the interconnect. An etching stopper film is formed at least over the second insulating layer. The etching stopper film is formed over the second insulating layer and the interconnect. A third insulating layer is formed over the etching stopper film. A via is provided in the third insulating layer so as to be connected to the interconnect.

13 Claims, 14 Drawing Sheets

SEMICONDUCTOR DEVICE AND METHOD OF MANUFACTURING SEMICONDUCTOR DEVICE

The application is based on Japanese patent application No. 2009-106389, the content of which is incorporated hereinto by reference.

BACKGROUND

1. Technical Field

The present invention relates to a semiconductor device in which an air gap is provided between an interconnect and an insulating film having the interconnect provided therein and a method of manufacturing a semiconductor device.

2. Related Art

With the reduction in the size of semiconductor devices, the gap between interconnects has been reduced. When the gap between the interconnects is reduced, the capacitance between the interconnects is increased, which causes a signal delay. As an example of a technique for reducing the capacitance between the interconnects, an air gap is provided between the interconnect and an insulating film having the interconnect provided therein.

U.S. Published patent application NO. 2008/0076258 discloses a structure in which, when a groove in which an interconnect is provided is formed in an insulating film, a damaged layer is formed on the side wall of the groove and the damaged layer is removed after the interconnect is formed, thereby forming an air gap between the interconnect and the insulating film.

Japanese Unexamined patent publication NO. 2008-300652 discloses a structure in which a catalytic characteristic film is formed on the bottom and the side of a groove in which an interconnect is provided, a Cu film, serving as the interconnect, is formed on the catalytic characteristic film, and the catalytic characteristic film on the side of the groove is removed, thereby forming an air gap between the interconnect and the insulating film.

Japanese Unexamined patent publication NO. 2008-205458 discloses a structure in which a metal cap is formed over an interconnect, the surface of an insulating film having the interconnect provided therein is damaged, and the damaged surface is removed, which is not a technique for forming an air gap.

The present inventor has recognized as follows. As shown in FIG. 14A, when a via 421 and an interconnect groove 422 are formed in an interconnect layer 420 that is provided on an interconnect layer 400 having an air gap 402 formed therein, positional deviation between the via 421 and the interconnect 404 of the interconnect layer 400 occurs. An opening region 424 that is connected to an upper part of the air gap 402 is formed on the bottom of the via 421 according to the degree of positional deviation. In the structure in which the opening region 424 is formed, as shown in FIG. 14B, when a diffusion barrier metal film 430 and a seed film 432 are formed in the via 421 and the interconnect groove 422, the diffusion barrier metal film 430 and the seed film 432 are not formed in and around the opening region 424. As a result, a void 426 is formed in an interconnect 434. Therefore, it is necessary to prevent a region that is connected to the air gap 402 from being formed on the bottom of the via 421 even when positional deviation between the interconnect 404 and the via 421 occurs.

SUMMARY

In one embodiment of the invention, there is provided a semiconductor device including: a first insulating layer; interconnects that are provided in the first insulating layer and has an upper surface which is higher than an upper surface of the first insulating layer; air gaps that are provided between the interconnects and the first insulating layer; a second insulating layer that is formed at least over the first insulating layer and the air gaps; an etching stopper film that is formed at least over the second insulating layer; a third insulating layer that is formed over the etching stopper film; and vias that are provided at least in the third insulating layer and are connected to the interconnects.

When the via is formed in the third insulating layer, the third insulating layer is etched to form a connection hole and the etching stopper film disposed on the bottom of the connection hole is etched. In the above-mentioned embodiment, the upper surface of the interconnect is higher than the upper surface of the first insulating layer. Therefore, the upper surface of the interconnect is higher than the upper end of the air gap, and the etching stopper film is separated from the air gap in the thickness direction. The second insulating layer is disposed between the etching stopper film and the air gap. Therefore, even though positional deviation between the via and the interconnect occurs when the connection hole, serving as the via, is formed in the third insulating layer and the connection hole overlaps the air gap in a plan view, the second insulating layer serves as an etching stopper when the etching stopper film disposed on the bottom of the connection hole is removed. As a result, it is possible to prevent the connection between the air gap and the connection hole.

In another embodiment of the invention, there is provided a method of manufacturing a semiconductor device. The method includes: forming a first insulating layer; forming grooves in the first insulating layer; forming interconnects in the grooves; forming spaces between the first insulating layer and the interconnects and disposing an upper surface of the interconnect at a position higher than an upper surface of the first insulating layer; forming air gaps in the spaces and forming a second insulating layer at least over the first insulating layer and the interconnects; forming an etching stopper film at least over the second insulating layer; forming a third insulating layer over the etching stopper film; and forming vias at least in the third insulating layer so as to be disposed over the interconnects.

According to the above-mentioned embodiments of the invention, it is possible to prevent connection between an air gap and a via even though positional deviation between the via and an interconnect occurs when a connection hole, serving as the via, is formed in the third insulating layer.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

Figure 1:
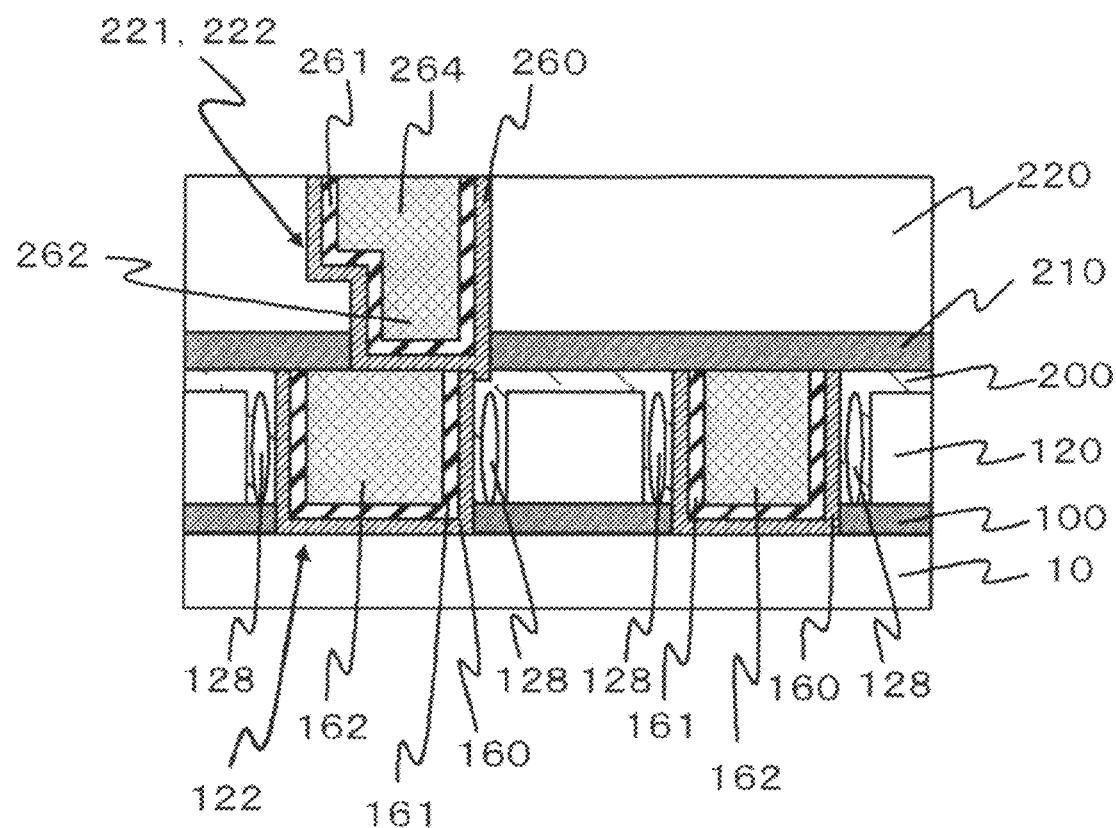
FIG. 1 is a cross-sectional view illustrating the structure of a semiconductor device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the same components are denoted by the same reference numerals and a description thereof will not be repeated.

(First Embodiment)

FIG. 1 is a cross-sectional view illustrating the structure of a semiconductor device according to a first embodiment of the invention. The semiconductor device includes a first insulating layer 120, interconnects 162, air gaps 128, a second insulating layer 200, an etching stopper film 210, a third insulating layer 220, and a via 262. The interconnects 162 are provided in the first insulating layer 120, and the upper surface of the interconnect 162 is higher than the upper surface of the first insulating layer 120. The air gap 128 is disposed between the interconnect 162 and the first insulating layer 120. The second insulating layer 200 is formed at least on the first insulating layer 120 and the air gaps 128. In the example shown in FIG. 1, the second insulating layer 200 does not cover the interconnect 162. The etching stopper film 210 is formed at least on the second insulating layer 200. In the example shown in FIG. 1, the etching stopper film 210 is formed on the second insulating layer 200 and the interconnect 162. The third insulating layer 220 is formed on the etching stopper film 210. The via 262 is provided in the third insulating layer 220 and is connected to the interconnect 162.

In the example shown in FIG. 1, a portion of the second insulating layer 200 is buried between the interconnect 162 and the first insulating layer 120. The air gap 128 is formed in the second insulating layer 200 that is disposed between the interconnect 162 and the first insulating layer 120. However, unlike the example shown in FIG. 1, the second insulating layer 200 may not be buried between the interconnect 162 and the first insulating layer 120, but the second insulating layer 200 may be formed so as to cover the space between the interconnect 162 and the first insulating layer 120, thereby forming the air gap 128. In the example shown in FIG. 1, it is considered that this structure is likely to be actually formed.

The interconnect 162 is provided in a groove 122 that is formed in the first insulating layer 120, and the via 262 is provided in a connection hole 221 that is formed in the third insulating layer 220. A groove 222 is formed in the third insulating layer 220 so as to be disposed over the connection hole 221. An interconnect 264 that is connected to the via 262 is provided in the groove 222. In the example shown in FIG. 1, the via 262 and the interconnect 264 are formed by the same process.

The interconnect 162, the via 262, and the interconnect 264 are formed by a plating method. Specifically, the interconnect 162 includes a seed film 161. A diffusion barrier metal film 160 is formed between the seed film 161 and the groove 122. Similarly, the via 262 and the interconnect 264 include a seed film 261. A diffusion barrier metal film 260 is formed between the groove 222 and the connection hole 221, and the seed film 261. The interconnect 162, the via 262, and the interconnect 264 are, for example, Cu films. Each of the diffusion barrier metal films 160 and 260 is, for example, a multi-layer film of a TaN film and a Ta film laminated in this order.

The first insulating layer 120, the second insulating layer 200, and the third insulating layer 220 are low-dielectric-constant films. For example, each of the first insulating layer 120, the second insulating layer 200, and the third insulating layer 220 is a SiCOH film, a SiCOHN film, or a porous film thereof and has a relative dielectric constant of equal to or less than 3.5, preferably, equal to or less than 2.7. The first insulating layer 120 is formed on an etching stopper film 100. The etching stopper film 100 is formed on an underlying insulating film 10. For example, the underlying insulating film 10 is an insulating film forming an interconnect layer that is provided below the interconnect 162.

FIGS. 2A to 6B are cross-sectional views illustrating a method of manufacturing the semiconductor device shown in FIG. 1. In the method of manufacturing the semiconductor device, first, the first insulating layer 120 is formed. Then, the groove 122 is formed in the first insulating layer 120. Then, the interconnect 162 is provided in the groove 122. Then, a space is formed between the first insulating layer 120 and the interconnect 162 and the upper surface of the interconnect 162 is disposed at a position higher than the upper surface of the first insulating layer 120. Then, the space is filled up with an insulator to form the air gap 128 and the second insulating layer 200 is formed on the first insulating layer 120 and the interconnect 162. Then, the etching stopper film 210 is formed on the second insulating layer 200, and the third insulating layer 220 is formed on the etching stopper film 210. Then, the via 262 that is disposed over the interconnect 162 is formed in the third insulating layer 220.

Next, the manufacturing method will be described in detail.

Figure 2A:
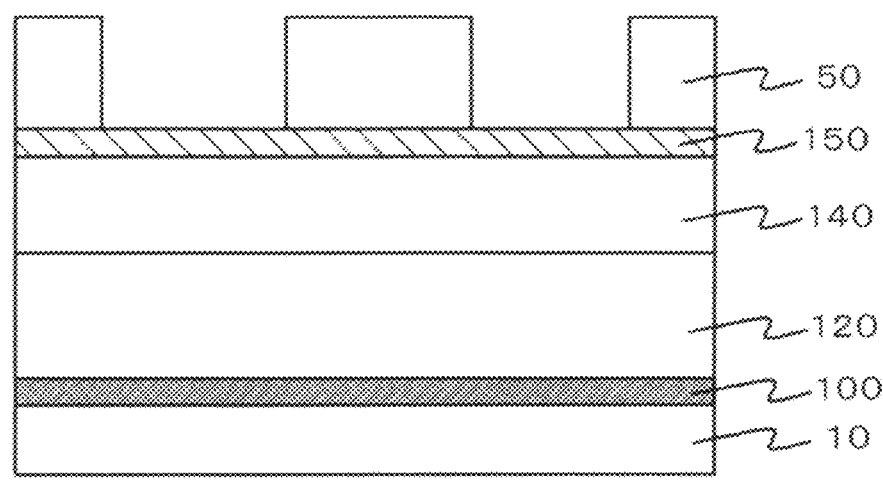
FIGS. 2A and 2B are cross-sectional views illustrating a method of manufacturing the semiconductor device shown in FIG. 1.

First, as shown in FIG. 2A, the etching stopper film 100 is formed on the underlying insulating film 10. The etching stopper film 100 is, for example, a SiCN film or a SiCNH film. However, the etching stopper film 100 may be a SiN film, a SiNH film, or a SiCOH film. The carbon concentration of the SiCOH film is higher than that of a SiCOH film forming the first insulating layer 120. For example, the carbon concentration is equal to or more than 20 at % and equal to or less than 45 at %. Then, the first insulating layer 120 and a silicon oxide layer 140 are formed on the etching stopper film 100. Then, an antireflection film 150 is formed on the silicon oxide layer 140. Then, a photo resist film 50 is formed on the antireflection film 150, and the photo resist film 50 is exposed and developed to form an opening pattern in the photo resist film 50.

Figure 2B:
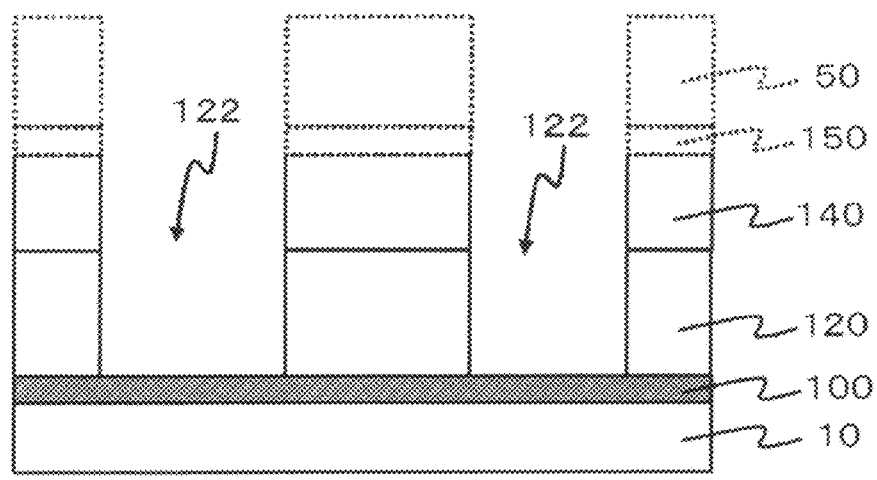

Then, as shown in FIG. 2B, dry etching is performed on the antireflection film 150, the silicon oxide layer 140, and the first insulating layer 120 using the photo resist film 50 as a mask. A fluorocarbon gas is used as the etching gas. In this way, the groove 122 is formed in the first insulating layer 120. Then, the photo resist film 50 and the antireflection film 150 are removed by plasma ashing using gas including oxygen.

Figure 3A:
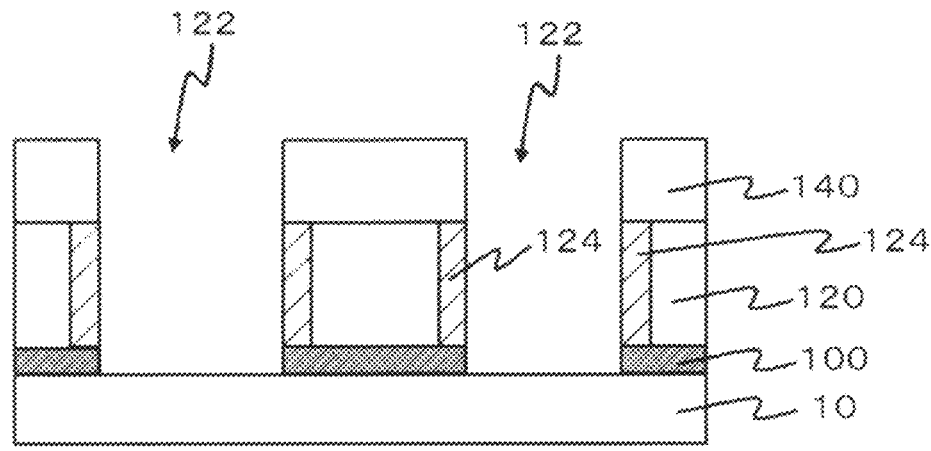
FIGS. 3A and 3B are cross-sectional views illustrating the next processes of FIGS. 2A and 2B.

Then, as shown in FIG. 3A, the etching stopper film 100 disposed on the bottom of the groove 122 is removed by dry etching. In this process, a portion of the silicon oxide layer 140 is removed. Then, the groove 122 is cleaned by a stripper for a photo resist film. The stripper is an amine-based solution.

In the state shown in FIG. 3A, a first damaged layer 124 is formed on the first insulating layer 120 that is disposed on the side wall of the groove 122. The first damaged layer 124 is a low carbon layer generated by a reduction in the carbon concentration of the first insulating layer 120.

Figure 3B:
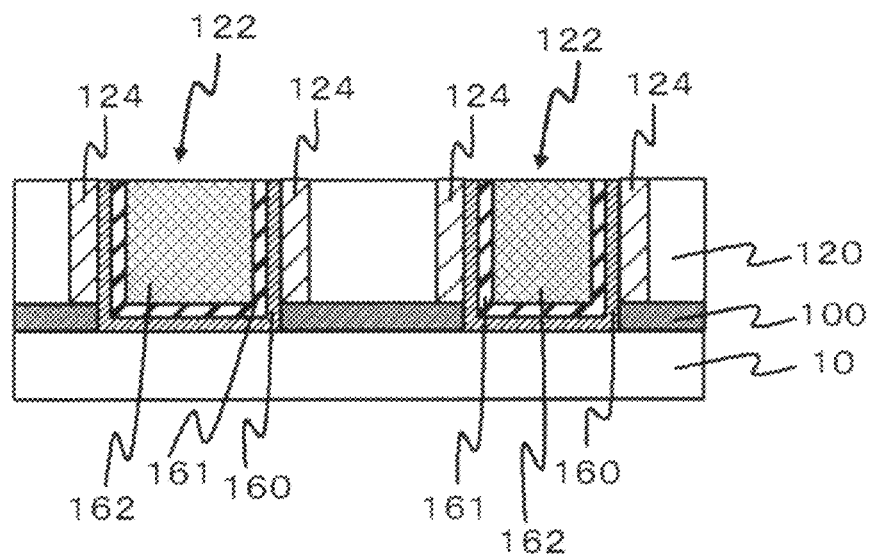

Then, as shown in FIG. 3B, the diffusion barrier metal film 160 and the interconnect 162 are provided in the groove 122. The details of this process are as follows. First, the diffusion barrier metal film 160 is formed on the bottom and the side wall of the groove 122 and on the silicon oxide layer 140 by, for example, a sputtering method. Then, the seed film 161 is formed on the diffusion barrier metal film 160 by, for example, a sputtering method. Then, plating is performed using the seed film 161 as a seed to form a conductive film. Then, the conductive film disposed on the silicon oxide layer 140, the seed film 161, the diffusion barrier metal film 160, and the silicon oxide layer 140 are removed by a chemical mechanical polishing (CMP) method. In this state, the surface of the first insulating layer 120 is exposed.

Figure 4A:
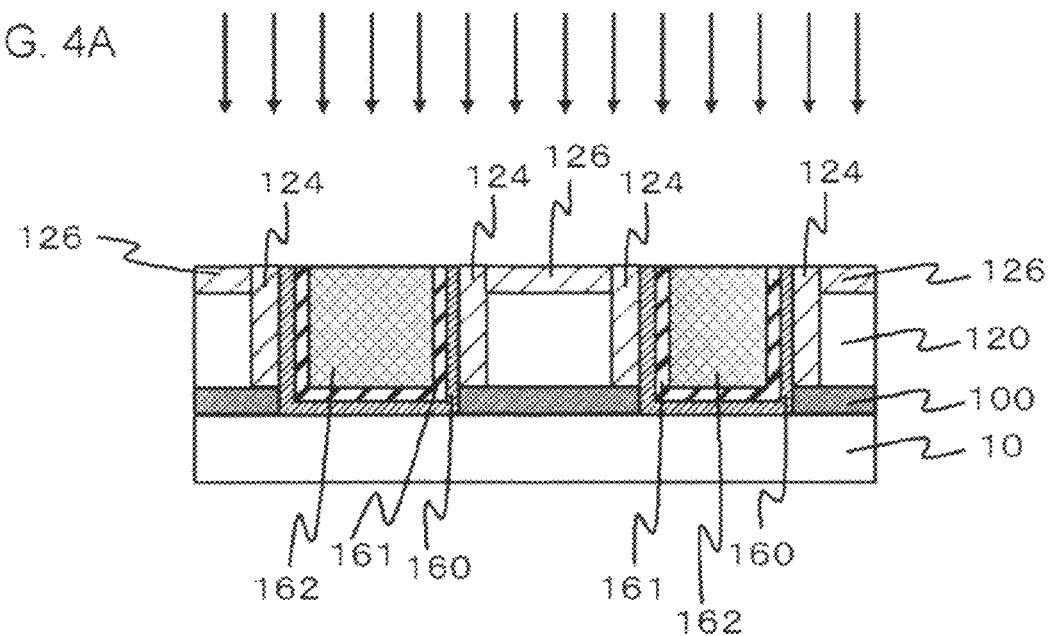
FIGS. 4A and 4B are cross-sectional views illustrating the next processes of FIGS. 3A and 3B.

Then, as shown in FIG. 4A, a second damaged layer 126 is formed on the surface of the first insulating layer 120. The second damaged layer 126 is a low carbon layer generated by a reduction in the carbon concentration of the first insulating layer 120 and is formed by, for example, processing the surface of the first insulating layer 120 with plasma including hydrogen. In this case, for example, an ammonia gas is used as at least a portion of the plasma gas.

Figure 4B:
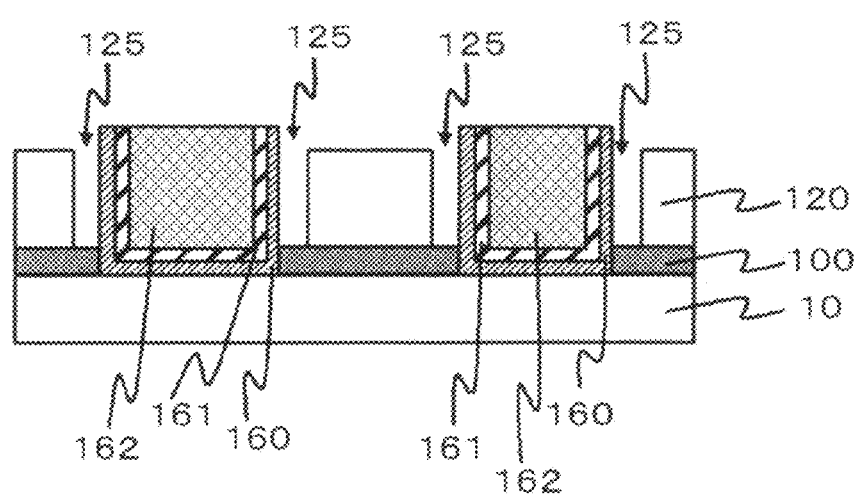

Then, as shown in FIG. 4B, the first damaged layer 124 and the second damaged layer 126 are removed by wet etching. For example, a dilute hydrofluoric acid (DHF) is used as an etchant. A space 125 disposed between the interconnect 162 and the first insulating layer 120 is formed in the first insulating layer 120 by the above-mentioned process. In addition, the upper surface of the interconnect 162 is higher than the upper surface of the first insulating layer 120. The first damaged layer 124 and the second damaged layer 126 may be removed by dry etching.

Figure 5A:
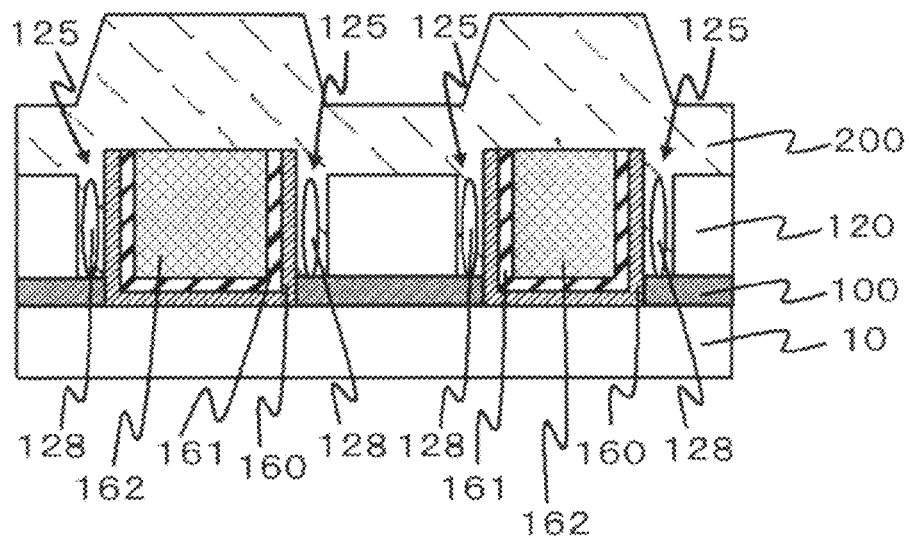
FIGS. 5A and 5B are cross-sectional views illustrating the next processes of FIGS. 4A and 4B.

Then, as shown in FIG. 5A, the second insulating layer 200 is formed on the first insulating layer 120, the space 125, and the interconnect 162. The second insulating layer 200 is formed by, for example, a plasma CVD method. In this state, the upper surface of a portion of the second insulating layer 200 that is disposed on the first insulating layer 120 is higher than the upper surface of the interconnect 162. The air gap 128 is formed in the space 125 by this process. A portion of the second insulating layer 200 gets into the space 125. However, the second insulating layer 200 may not get into the space 125 according to the conditions for forming the second insulating layer 200.

Figure 5B:
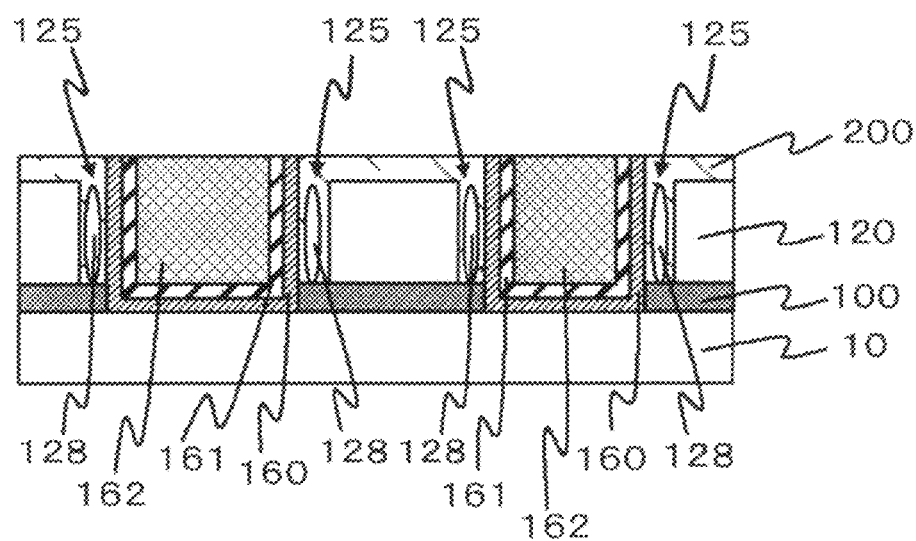

Then, as shown in FIG. 5B, the outer layer of the second insulating layer 200 is polished and removed by a chemical mechanical polishing (CMP) method. In the example shown in FIG. 5B, since the second insulating layer 200 disposed on the interconnect 162 is removed, the interconnect 162 is exposed from the second insulating layer 200. However, the second insulating layer 200 remains on the air gap 128.

Figure 6A:
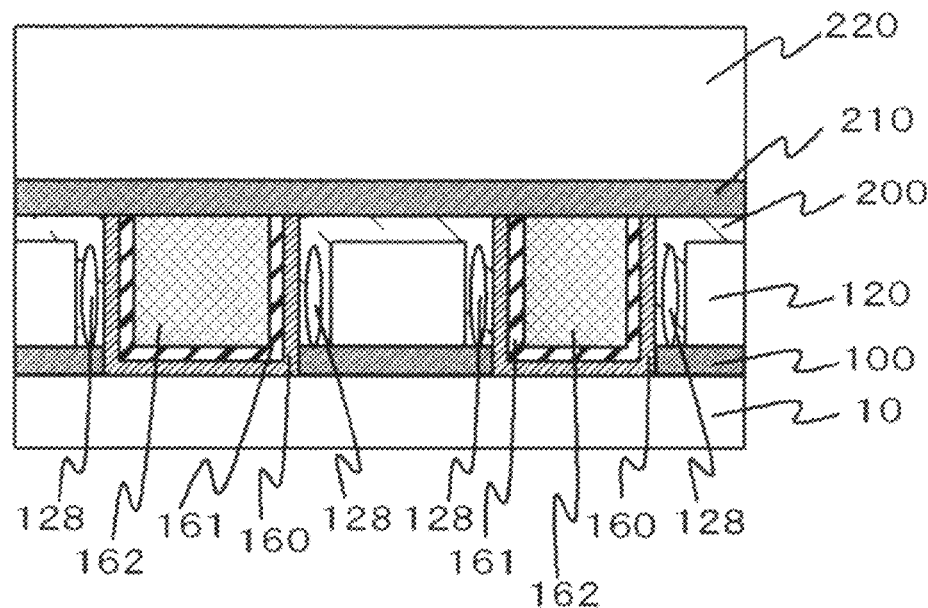
FIGS. 6A and 6B are cross-sectional views illustrating the next processes of FIGS. 5A and 5B.

Then, as shown in FIG. 6A, the etching stopper film 210 is formed on the second insulating layer 200 and the interconnects 162. The etching stopper film 210 is, for example, a SiCN film and is formed by, for example, a plasma CVD method. Then, the third insulating layer 220 is formed on the etching stopper film 210 by, for example, a plasma CVD method. The third insulating layer 220 is, for example, a SiCOH film.

Figure 6B:
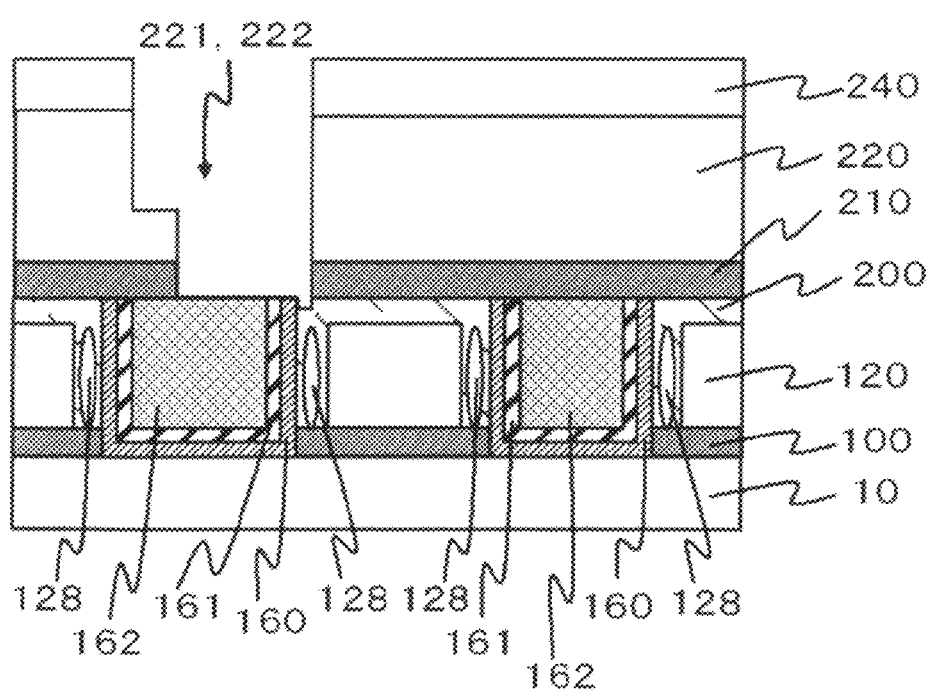

Then, as shown in FIG. 6B, a silicon oxide layer 240 is formed on the third insulating layer 220 by, for example, a plasma CVD method. Then, the connection hole 221 and the groove 222 are formed in the third insulating layer 220 by, for example, a dual damascene method. The connection hole 221 is disposed over the interconnect 162.

When etching is performed to form the connection hole 221, first, the third insulating layer 220 is etched using the etching stopper film 210 as a stopper. In this way, the connection hole 221 is formed in the third insulating layer 220, but the etching stopper film 210 remains on the bottom of the connection hole 221. Then, the etching stopper film 210 remaining on the bottom of the connection hole 221 is removed by etching.

In this process, as shown in FIG. 6B, positional deviation between the connection hole 221 and the interconnect 162 occurs, which causes the connection hole 221 to overlap the air gap 128, when seen in a plan view. However, in this embodiment, the second insulating layer 200 is disposed between the air gap 128 and the etching stopper film 210. Therefore, when the etching stopper film 210 disposed on the bottom of the connection hole 221 is removed, the second insulating layer 200 serves as an etching stopper, and the connection between the air gap 128 and the connection hole 221 is prevented.

Then, as shown in FIG. 1, the diffusion barrier metal film 260 and the via 262 are provided in the connection hole 221, and the diffusion barrier metal film 260 and the interconnect 264 are provided in the groove 222. The details of this process are as follows. First, the diffusion barrier metal film 260 is formed on the bottom and the side wall of the connection hole 221 and the groove 222 and on the silicon oxide layer 240 (for example, see FIG. 6B) by, for example, a sputtering method. Then, the seed film 261 is formed on the diffusion barrier metal film 260 by, for example, a sputtering method. Then, plating is performed using the seed film 261 as a seed to form a conductive film. Then, the conductive film on the silicon oxide layer 240, the seed film 261, the diffusion barrier metal film 260, and the silicon oxide layer 240 are removed by a CMP method.

Next, the operation and effects of this embodiment will be described. According to this embodiment, before the second insulating layer 200 is formed, the upper surface of the interconnect 162 is disposed at a position higher than the upper surface of the first insulating layer 120. Therefore, even when the outer layer of the second insulating layer 200 is polished and removed by a CMP method, a portion of the second insulating layer 200 remains on the air gap 128. Therefore, even when positional deviation between the connection hole 221 and the interconnect 162 occurs and the connection hole 221 overlaps the air gap 128 in a plan view, the second insulating layer 200 serves as an etching stopper when the etching stopper film 210 disposed on the bottom of the connection hole 221 is removed, and the connection between the air gap 128 and the connection hole 221 is prevented.

Therefore, it is possible to prevent the generation of a region in which the diffusion barrier metal film 260 and the seed film 261 are not formed in the side wall and the bottom of the connection hole 221. As a result, it is possible to prevent a void from being formed in the via 262.

In this embodiment, since the air gap 128 is formed by the second insulating layer 200, it is not necessary to form another film in order to form the air gap 128. Therefore, it is possible to prevent an increase in the number of processes for manufacturing a semiconductor device.

The second damaged layer 126 is formed on the upper surface of the first insulating layer 120, and the second damaged layer 126 is removed such that the upper surface of the interconnect 162 is higher than the upper surface of the first insulating layer 120. The removal of the second damaged layer 126 is performed by the same process as that for removing the first damaged layer 124 and forming the space 125 for forming the air gap 128. Therefore, it is possible to prevent an increase in the number of processes for manufacturing a semiconductor device.

The first insulating layer 120 is processed by plasma including hydrogen to form the second damaged layer 126. Therefore, when the second damaged layer 126 is formed, it is possible to prevent a damaged layer, for example, an oxide layer from being formed on the surface of the interconnect 162.

The second insulating layer 200 with a low dielectric constant is arranged in the space formed by reducing the upper surface of the first insulating layer 120 to be lower than the upper surface of the interconnect 162, that is, a space between the upper parts of the interconnects 162. Therefore, it is possible to prevent an increase in capacitance between the interconnects 162.

(Second Embodiment)

Figure 7:
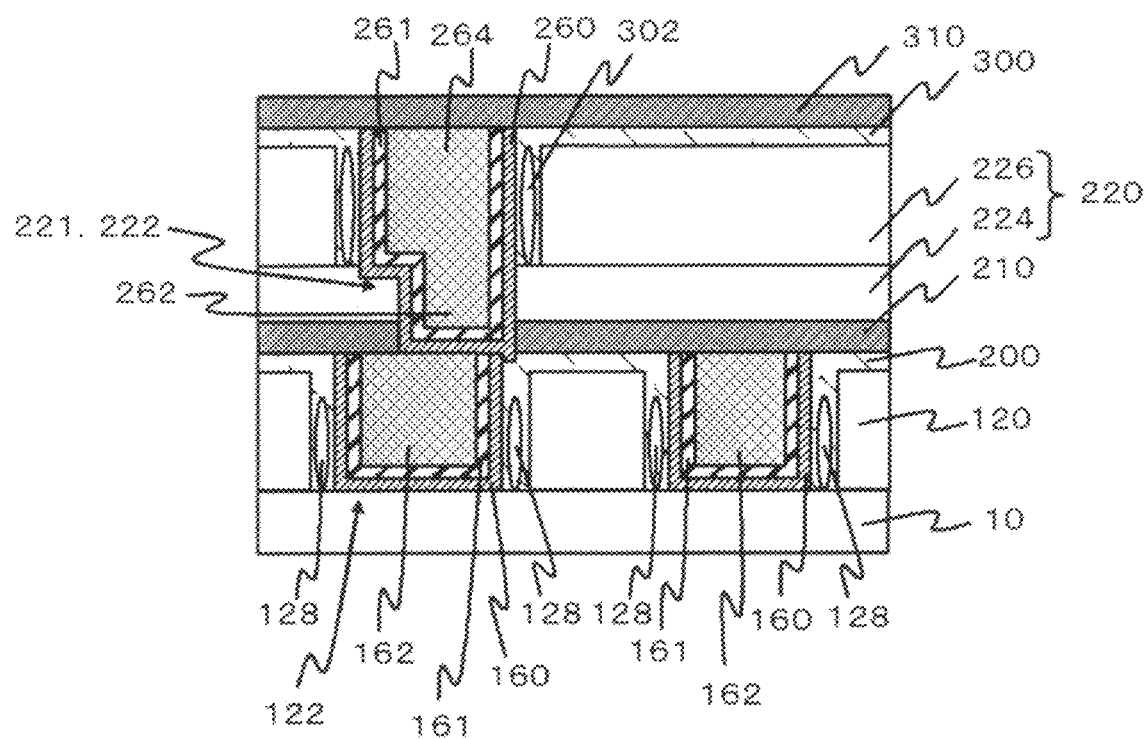
FIG. 7 is a cross-sectional view illustrating the structure of a semiconductor device according to a second embodiment of the invention.

FIG. 7 is a cross-sectional view illustrating the structure of a semiconductor device according to a second embodiment of the invention. The semiconductor device has the same structure as that according to the first embodiment except for the following points. First, the underlying insulating film 10 is an insulating film in which a via connected to the interconnect 162 is formed. Therefore, the etching stopper film 100 according to the first embodiment is not formed between the underlying insulating film 10 and the first insulating layer 120.

The third insulating layer 220 includes an insulating interlayer 224 and an interconnect layer insulating layer 226. The via 262 is provided in the insulating interlayer 224, and the interconnect 264 is provided in the interconnect layer insulating layer 226. An air gap 302 is formed between the interconnect 264 and the interconnect layer insulating layer 226, and an insulating layer 300 and an etching stopper film 310 are formed on the interconnect layer insulating layer 226. The air gap 302 is formed by the insulating layer 300. A method of forming the air gap 302, the insulating layer 300, and the etching stopper film 310 is the same as that forming the air gap 128, the second insulating layer 200, and the etching stopper film 210. The upper surface of the interconnect layer insulating layer 226 is lower than the upper surface of the interconnect 264. A method of reducing the upper surface of the interconnect layer insulating layer 226 to be lower than the upper surface of the interconnect 264 is the same as that of reducing the upper surface of the first insulating layer 120 to be lower than the upper surface of the interconnect 162.

In this embodiment, it is also possible to obtain the same effects as those in the first embodiment. In addition, since the air gap 302 is also formed between the interconnect 264 and the interconnect layer insulating layer 226, it is possible to reduce capacitance between the interconnects that are arranged in the same layer as that in which the interconnect 264 is arranged.

(Third Embodiment)

Figure 9A:
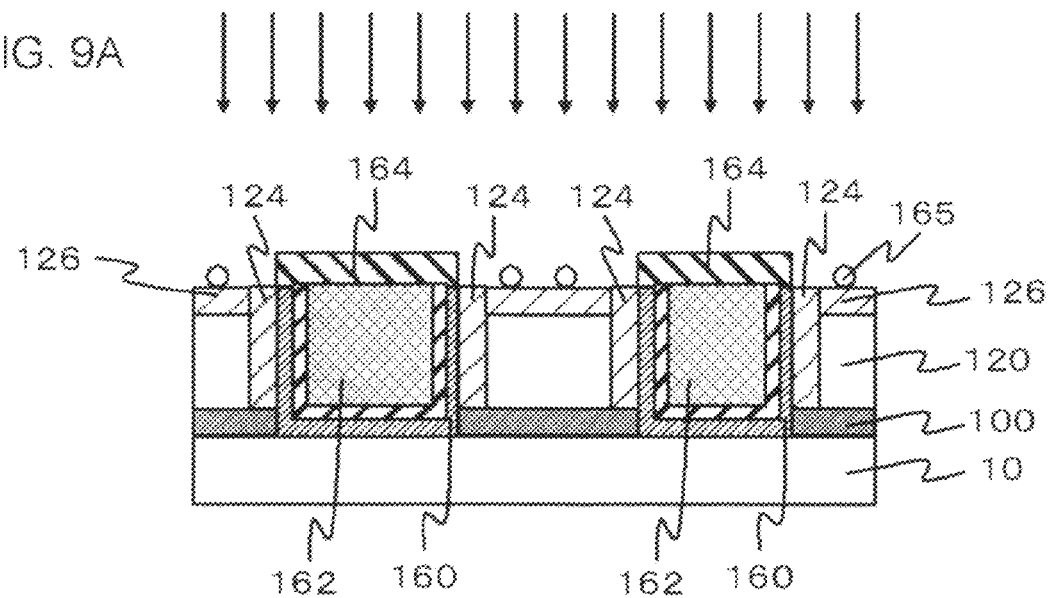
FIGS. 9A and 9B are cross-sectional views illustrating the next processes of FIGS. 8A and 8B.
Figure 9B:
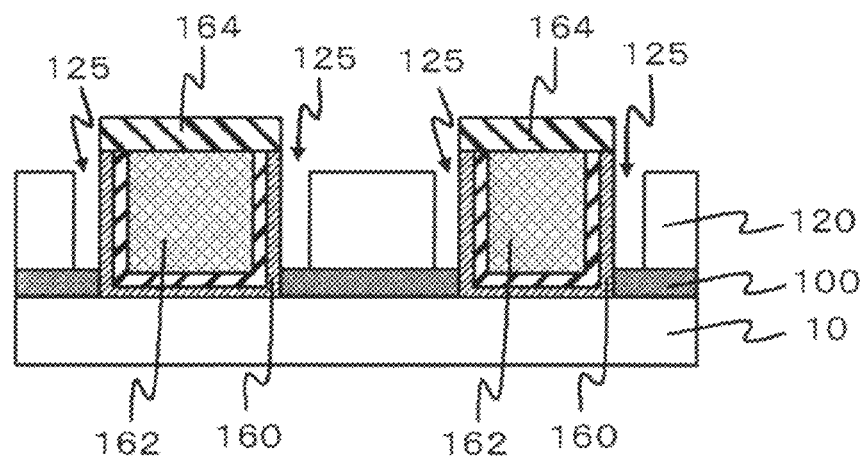
Figure 10:
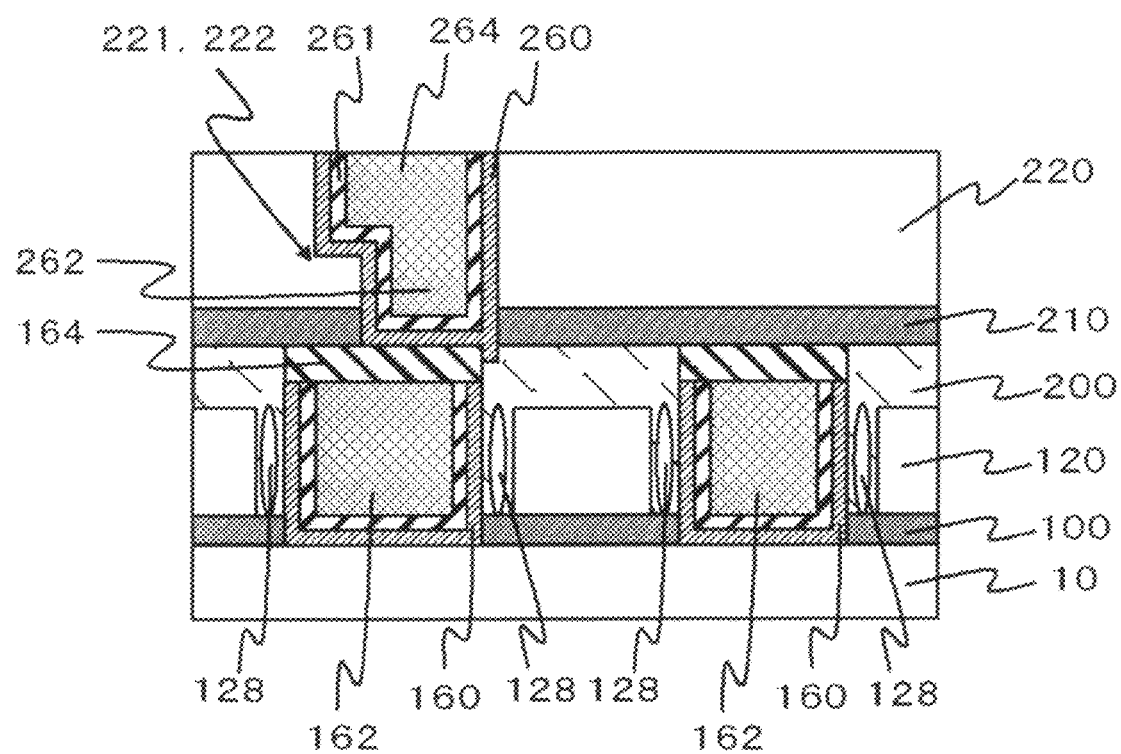
FIG. 10 is a cross-sectional view illustrating the next process of FIGS. 9A and 9B.

FIGS. 8A to 10 are cross-sectional views illustrating a method of manufacturing a semiconductor device according to a third embodiment of the invention. As shown in FIG. 10, the semiconductor device manufactured by the method has the same structure as the semiconductor device according to the first embodiment except that a metal cap film 164 is provided on the interconnect 162. The metal cap film 164 is, for example, a CoWP film. Alternatively, the metal cap film 164 may be a CoWB film or a film plated with a Ni-based material.

Figure 8A:
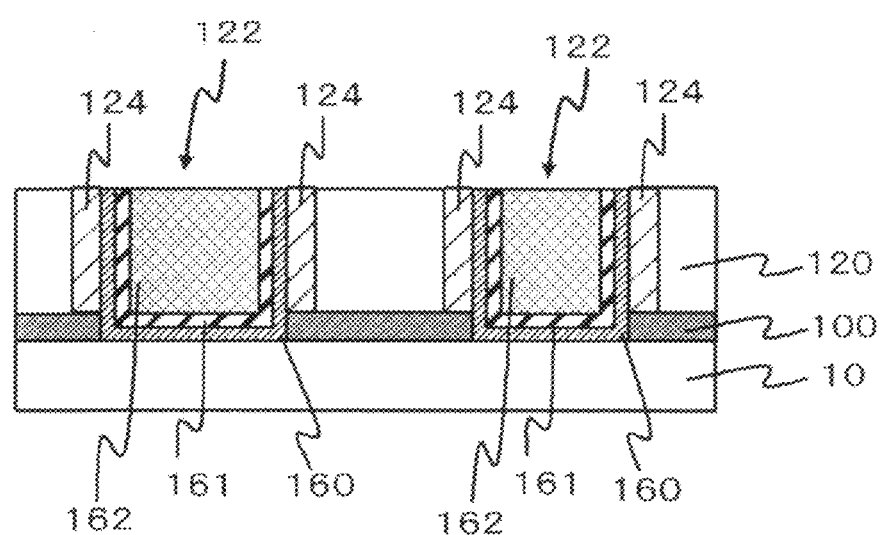
FIGS. 8A and 8B are cross-sectional views illustrating a method of manufacturing a semiconductor device according to a third embodiment of the invention.

First, as shown in FIG. 8A, the etching stopper film 100, the first insulating layer 120, the grooves 122, the first damaged layer 124, the diffusion barrier metal film 160, the seed film 161, and the interconnects 162 are formed on the underlying insulating film 10. A process of forming the components is the same as that in the first embodiment.

Figure 8B:
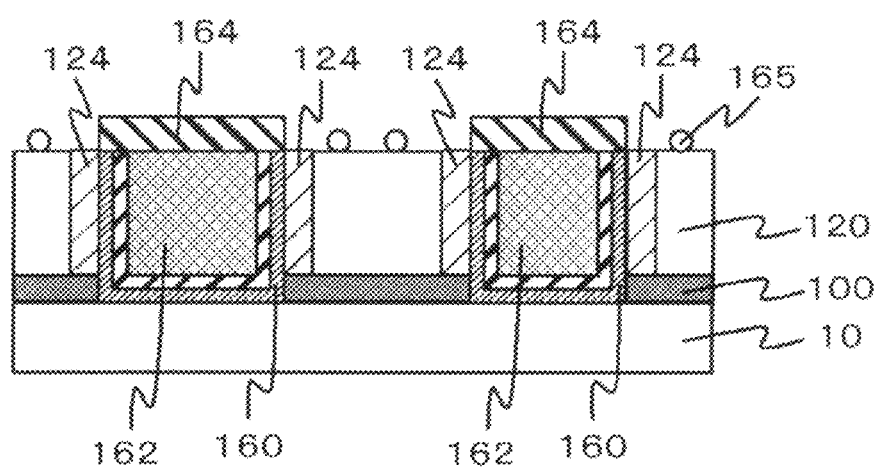

Then, as shown in FIG. 8B, the metal cap film 164 is selectively formed on the interconnect 162 by an electroless method. In this process, a deposit 165 is inevitably formed on the first insulating layer 120. The metal cap film 164 may be formed by a selective CVD method. In this case, the metal cap film 164 may be made of W or Co. Alternatively, the metal cap film 164 may be made of at least one selected from Si, Ag, Mg, Be, Zn, Pd, Cd, Au, Hg, Pt, Zr, Ti, Sn, Ni, and Fe.

Then, as shown in FIG. 9A, the second damaged layer 126 is formed on the surface of the first insulating layer 120. A method of forming the second damaged layer 126 is the same as that in the first embodiment.

Then, as shown in FIG. 9B, the first damaged layer 124 and the second damaged layer 126 are removed. A method of removing the layers is the same as that in the first embodiment. In this process, the deposit 165 is removed together with the second damaged layer 126.

Then, as shown in FIG. 10, the second insulating layer 200, the etching stopper film 210, the third insulating layer 220, the connection hole 221, the groove 222, the diffusion barrier metal film 260, the seed film 261, the via 262, and the interconnect 264 are formed. A method of forming the components is the same as that in the first embodiment. However, in this embodiment, the diffusion barrier metal film 260 is not a multi-layer film of a TaN film and a Ta film laminated in this order, but it may be, for example, a SiCH film.

According to this embodiment, it is also possible to obtain the same effects as those in the first embodiment. Since the second insulating layer 200 is formed after the metal cap film 164 is formed on the interconnect 162, a portion of the second insulating layer 200 that is disposed over the air gap 128 is thicker than that according to the first embodiment. Therefore, even when the connection hole 221 overlaps the air gap 128 in a plan view, it is possible to prevent the connection between the air gap 128 and the connection hole 221 when the etching stopper film 210 disposed on the bottom of the connection hole 221 is removed.

Since the metal cap film 164 is formed on the interconnect 162, the electromigration resistance of the interconnect 162 is improved. In addition, since the metal cap film 164 also serves as a diffusion barrier metal film of the interconnect 162, it is possible to use a SiCH film with a low dielectric constant as the diffusion barrier metal film 260.

In this embodiment, the structure of each layer may be the same as that according to the second embodiment.

(Fourth Embodiment)

Figure 11A:
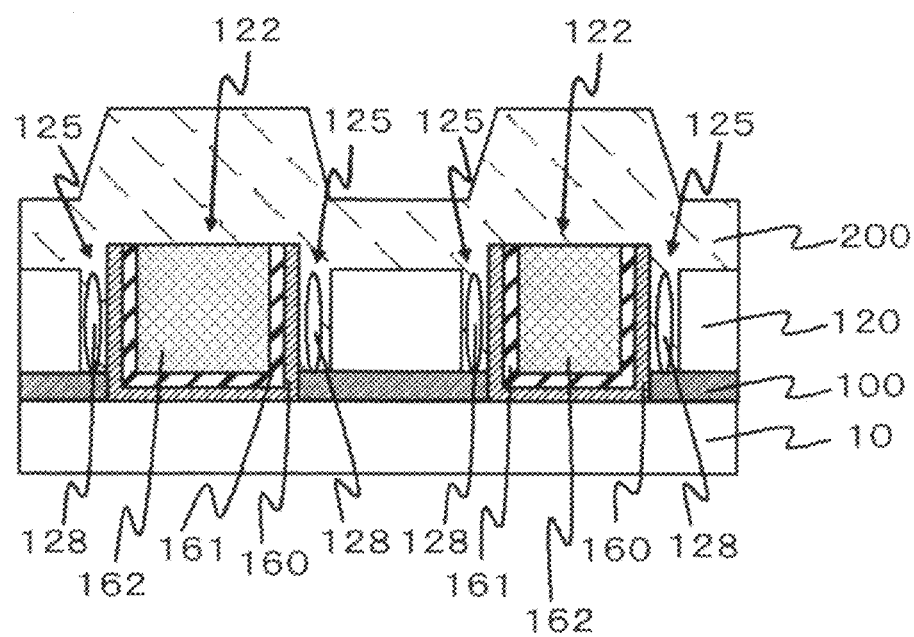
FIGS. 11A and 11B are cross-sectional views illustrating a method of manufacturing a semiconductor device according to a fourth embodiment of the invention.
Figure 11B:
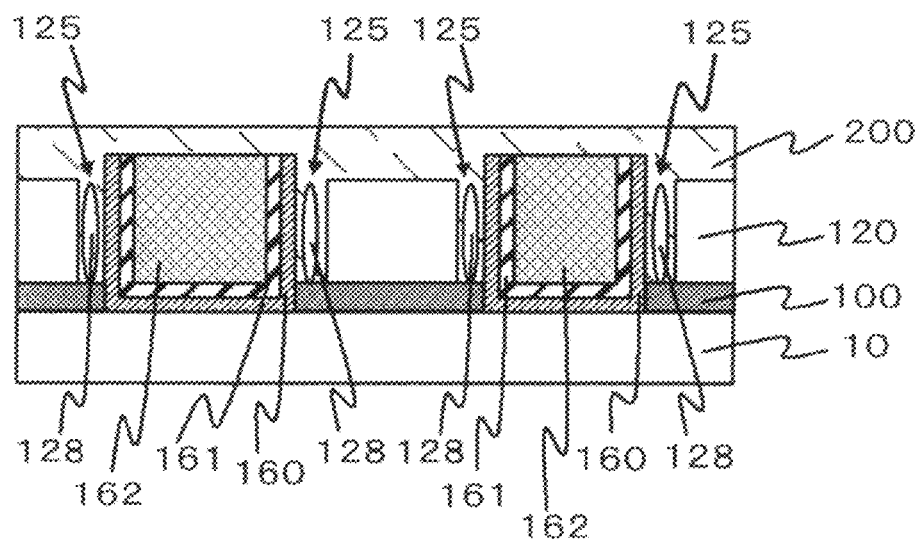
Figure 12:
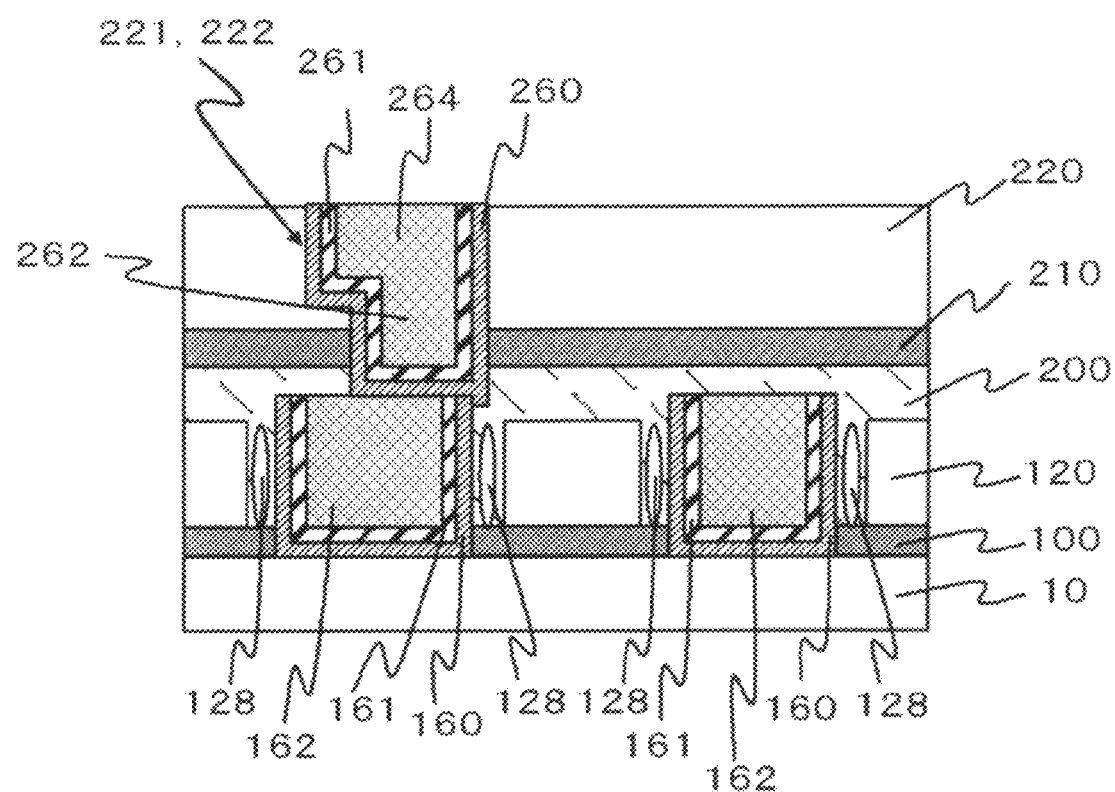
FIG. 12 is a cross-sectional view illustrating the next process of FIGS. 11A and 11B.

FIGS. 11A, 11B and FIG. 12 are cross-sectional views illustrating a method of manufacturing a semiconductor device according to a fourth embodiment of the invention. The method of manufacturing the semiconductor device according to this embodiment is similar to that according to the first embodiment except that, when the outer layer of the second insulating layer 200 is removed by a CMP method, the second insulating layer 200 remains on the interconnect 162. That is, in the semiconductor device manufactured in this embodiment, the upper surface of the interconnect 162 is covered with the second insulating layer 200 and a lower part of the via 262 is provided in the second insulating layer 200, which will be described in detail below.

First, as shown in FIG. 11A, the etching stopper film 100, the first insulating layer 120, the grooves 122, the diffusion barrier metal film 160, the seed film 161, the interconnects 162, the spaces 125, the air gaps 128, and the second insulating layer 200 are formed on the underlying insulating film 10. A method of forming the components is the same as that in the first embodiment. In the state shown in FIG. 11A, the upper surface of the interconnect 162 is higher than the upper surface of the first insulating layer 120. A method of making the upper surface of the interconnect 162 higher than the upper surface of the first insulating layer 120 is the same as that in the first embodiment.

Then, as shown in FIG. 11B, the outer layer of the second insulating layer 200 is polished and removed by a CMP method. In this case, the second insulating layer 200 remains on the interconnect 162. The thickness of the second insulating layer 200 disposed on the interconnect 162 is, for example, equal to or more than 5 nm and equal to or less than 50 nm, which is smaller than that of the third insulating layer 220.

Then, as shown in FIG. 12, the etching stopper film 210; the third insulating layer 220, the connection hole 221, the groove 222, the diffusion barrier metal film 260, the seed film 261, the via 262, and the interconnect 264 are formed. A method of forming the components is the same as that in the first embodiment except that, in a process of forming the connection hole 221, after the etching stopper film 210 is etched, the second insulating layer 200 is etched to dispose the bottom of the connection hole 221 in the second insulating layer 200.

In this embodiment, when the etching stopper film 210 disposed on the bottom of the connection hole 221 is removed, the second insulating layer 200 serves as an etching stopper. It is necessary to remove the etching stopper film 210 last in order to expose the interconnect 162 to the bottom of the connection hole 221. The upper surface of the interconnect 162 is higher than the upper surface of the first insulating layer 120. Therefore, a portion of the second insulating layer 200 that is disposed over the air gap 128 is thicker than another portion that is disposed over the interconnect 162. Therefore, even when the connection hole 221 overlaps the air gap 128 in a plan view, it is possible to prevent the connection between the air gap 128 and the connection hole 221 when the second insulating layer 200 is etched to expose the interconnect 162 to the bottom of the connection hole 221.

In addition, since the second insulating layer 200 remains on the interconnect 162, it is not necessary to consider selectivity between the interconnect 162 and the second insulating layer 200 in the process of removing the outer layer of the second insulating layer 200 using a CMP method.

The interconnect 162 and the upper surface thereof are surrounded by the second insulating layer 200. Therefore, it is possible to further reduce capacitance between the interconnects 162.

In this embodiment, the structure of each layer may be the same as that according to the second embodiment.

(Fifth Embodiment)

Figure 13:
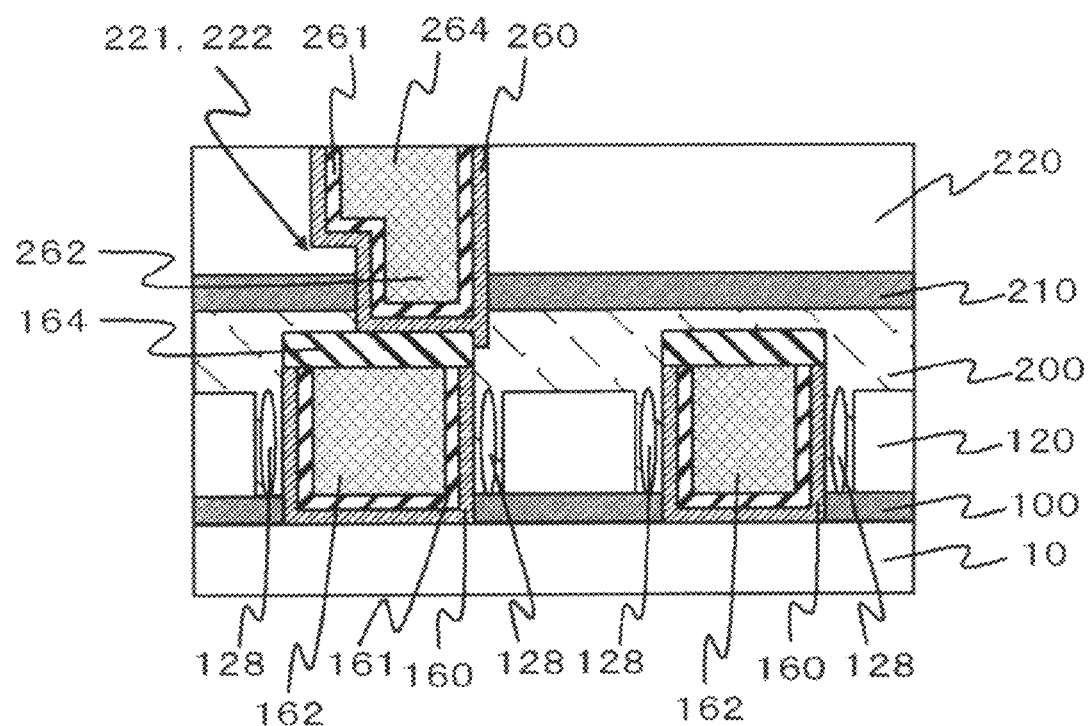
FIG. 13 is a cross-sectional view illustrating the structure of a semiconductor device according to a fifth embodiment of the invention.
Figure 14A:
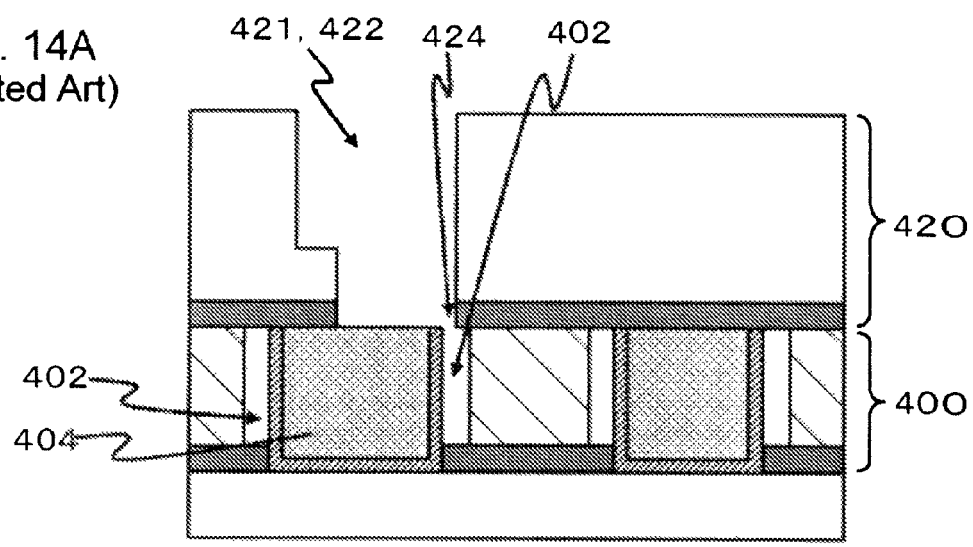
FIGS. 14A and 14B are cross-sectional views illustrating problems when a connection hole and an air gap are connected to each other.
Figure 14B:
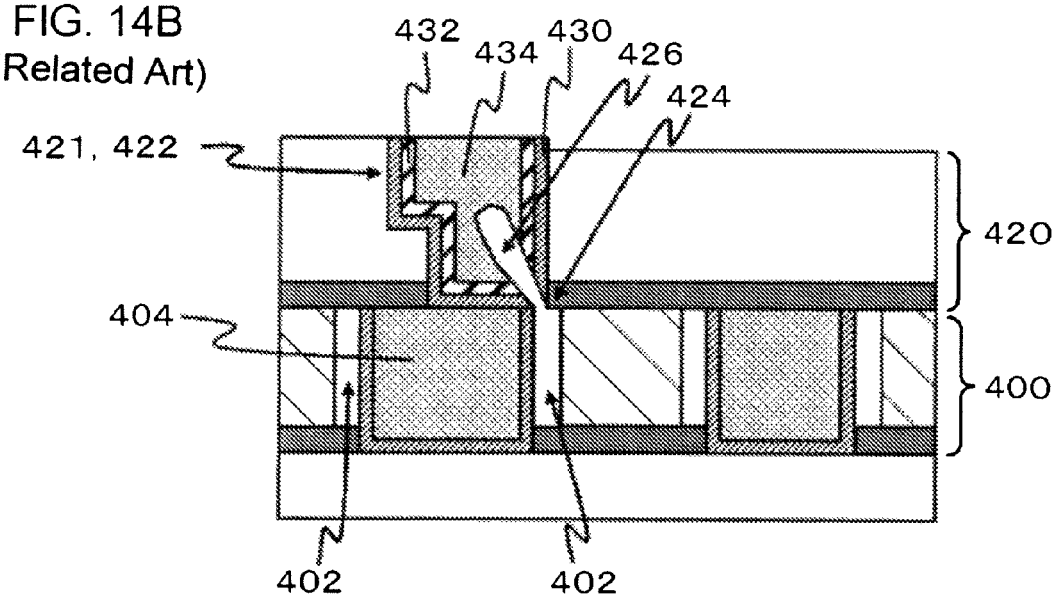

FIG. 13 is a cross-sectional view illustrating the structure of a semiconductor device according to a fifth embodiment of the invention. The semiconductor device according to this embodiment has the same structure as the semiconductor device manufactured in the fourth embodiment except that the metal cap film 164 is provided on the interconnect 162. The second insulating layer 200 remains on the metal cap film 164. A method of forming the metal cap film 164 is the same as that in the third embodiment.

In this embodiment, it is also possible to obtain the same effects as those in the fourth embodiment. The thickness of a portion of the second insulating layer 200 that is disposed over the air gap 128 is more than that of another portion that is disposed over the interconnect 162 by a value corresponding to the thickness of the metal cap film 164, as compared to the fourth embodiment. Therefore, even when the connection hole 221 overlaps the air gap 128 in a plan view, it is possible to prevent the connection between the air gap 128 and the connection hole 221 when the second insulating layer 200 disposed on the bottom of the connection hole 221 is removed.

Since the interconnect 162 is surrounded by the diffusion barrier metal film 160 and the metal cap film 164, it is possible to prevent the metal material forming the interconnect 162 from being diffused into the second insulating layer 200.

In this embodiment, the structure of each layer may be the same as that according to the second embodiment.

The embodiments of the invention have been described with reference to the drawings, but the invention is not limited thereto. Various structures other than the above may be used.

It is apparent that the present invention is not limited to the above embodiment, but may be modified and changed without departing from the scope and spirit of the invention.

What is claimed is:

1. A semiconductor device comprising:
a first insulating layer;
interconnects that are provided in said first insulating layer and have an upper surface which is higher than an upper surface of said first insulating layer;
air gaps that are provided between said interconnects and a sidewall of said first insulating layer in a direction perpendicular to the sidewall of the first insulating layer;
a second insulating layer that is formed at least over said first insulating layer and said air gaps;
an etching stopper film that is formed at least over said second insulating layer;
a third insulating layer that is formed over said etching stopper film; and
vias that are provided at least in said third insulating layer and are connected to said interconnects.

2. The semiconductor device as set forth in claim 1, wherein said air gap is formed in said second insulating layer.

3. The semiconductor device as set forth in claim 1, wherein said second insulating layer has a relative dielectric constant of equal to or less than 3.5.

4. The semiconductor device as set forth in claim 1, wherein said upper surface of said interconnect is not covered with said second insulating layer, and
said etching stopper film is formed over said interconnect.

5. The semiconductor device as set forth in claim 1, wherein said upper surface of said interconnect is covered with said second insulating layer, and
a lower part of said via is provided in said second insulating layer.

6. The semiconductor device as set forth in claim 1, further comprising:

a metal cap film that is provided over said interconnects.

7. The semiconductor device as set forth in claim 1, wherein said via is formed by a plating method.

8. The semiconductor device as set forth in claim 1, wherein said first insulating layer is a SiCOH film, a SiCOHN film, or a porous film of said SiCOH film or said SiCOHN film.

9. The semiconductor device as set forth in claim 1, wherein the etching stopper film is formed on the upper surface of the interconnects and an upper surface of the second insulating layer.

10. A semiconductor device comprising:

a first insulating layer;

interconnects that are provided in said first insulating layer and have an upper surface which is higher than an upper surface of said first insulating layer;

air gaps that are provided between said interconnects and said first insulating layer;

a second insulating layer that is formed at least over said first insulating layer and said air gaps;

an etching stopper film that is formed at least over said second insulating layer;

a third insulating layer that is formed over said etching stopper film; and vias that are provided at least in said third insulating layer and are connected to said interconnects, wherein the upper surface of the interconnects is co-planar with an upper surface of the second insulating layer.

11. The semiconductor device as set forth in claim 10, wherein the vias are formed on the upper surface of the interconnects.

12. A semiconductor device comprising:

a first insulating layer;

interconnects that are provided in said first insulating layer and have an upper surface which is higher than an upper surface of said first insulating layer;

air gaps that are provided between said interconnects and said first insulating layer;

a second insulating layer that is formed at least over said first insulating layer and said air gaps;

an etching stopper film that is formed at least over said second insulating layer;

a third insulating layer that is formed over said etching stopper film; and vias that are provided at least in said third insulating layer and are connected to said interconnects, wherein the air gaps are formed in the second insulating layer such that the second insulating layer comprises an upper portion which is formed between the air gaps and the etching stopper film.

13. The semiconductor device as set forth in claim 12, wherein the vias comprise a bottom edge portion which is formed on the upper portion of the second insulating layer at the upper surface of the interconnects.

* * * * *